(12) United States Patent
Yang et al.

(10) Patent No.: US 11,329,194 B2
(45) Date of Patent: May 10, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Weiwei Yang, Hubei (CN); Cheng Chen, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 111 days.

(21) Appl. No.: 16/754,632

(22) PCT Filed: Aug. 16, 2019

(86) PCT No.: PCT/CN2019/101007
§ 371 (c)(1),
(2) Date: Apr. 8, 2020

(87) PCT Pub. No.: WO2021/012333
PCT Pub. Date: Jan. 28, 2021

(65) Prior Publication Data
US 2021/0098652 A1    Apr. 1, 2021

(30) Foreign Application Priority Data
Jul. 23, 2019   (CN) .......................... 201910667220.2

(51) Int. Cl.
*H01L 33/38*   (2010.01)
*H01L 33/42*   (2010.01)
*G06F 1/16*    (2006.01)

(52) U.S. Cl.
CPC ............ *H01L 33/382* (2013.01); *H01L 33/42* (2013.01); *G06F 1/1605* (2013.01)

(58) Field of Classification Search
CPC ... H01L 33/382; H01L 33/42; H01L 27/3234; H01L 27/3248; G06F 1/1605; G06F 1/1637; G06F 1/1686; G06F 1/1626
See application file for complete search history.

(56) References Cited

U.S. PATENT DOCUMENTS

2002/0026976 A1   3/2002   Mitsumori et al.
2012/0091459 A1*  4/2012   Choi ................... H01L 51/5215
                                                          257/59

(Continued)

FOREIGN PATENT DOCUMENTS

CN    105789260 A    7/2016
CN    108807487 A    11/2018
(Continued)

*Primary Examiner* — Su C Kim
(74) *Attorney, Agent, or Firm* — The Roy Gross Law Firm, LLC; Roy Gross

(57) ABSTRACT

A display panel and a display device are provided. When manufacturing a first electrode, by depositing a first transparent electrode layer, a first metal layer, and a second transparent electrode layer on a region of the display panel, and etching the first transparent electrode layer, the first metal layer, and the second transparent electrode layer on the thinned-down region; and afterwards, depositing a third transparent electrode layer, a second metal layer, and a fourth transparent electrode layer, a first electrode of the display panel is formed.

8 Claims, 5 Drawing Sheets

(56) References Cited

U.S. PATENT DOCUMENTS

2012/0097967 A1*  4/2012  Choi .................. H01L 27/3262
                                                        257/72
2016/0093647 A1*  3/2016  Kim .................. H01L 29/66757
                                                        349/46

FOREIGN PATENT DOCUMENTS

CN        109683740 A     4/2019
CN        109868452 A     6/2019

* cited by examiner

DISPLAY PANEL AND DISPLAY DEVICE

FIELD OF INVENTION

The present disclosure relates to the field of display, and particularly relates to a display panel and a display device.

BACKGROUND OF INVENTION

Because organic light emitting diodes (OLEDs) have many advantages, such as light weight, self illumination, wide viewing angles, low driving voltages, high luminous efficacy, low power consumption, rapid response time, etc., their application range is becoming wider. OLED display devices have characteristics of bendability and portability, and have become the main area of research and development of the field of the display technology. Currently, a hole generally is dug on a position of a camera on a panel of a mobile phone, which makes a camera region to be light transmissive. However, this technology may affect a screen-to-body ratio, and screen experience may be poor, so it is urgent to develop technology that disposes the camera under the screen, without cutting the screen, and when the camera is used, the screen directly above the camera does not display, and when the camera is not used, the screen displays normally. This technology can increase the screen-to-body ratio.

Therefore, it is necessary to provide a new type of display panel to increase a screen-to-body ratio and an optical transmittance rate of the display panel, thereby improving picture experience and realizing true full screen technology.

SUMMARY OF INVENTION

The purpose of the present disclosure is to provide a display panel and a display device, by thinning down a first electrode on a thinned-down region, an optical transmittance rate of the thinned-down region can be increased, and finally improves photography performance.

The present disclosure provides a display device, including a light transmissive region, a thinned-down region, and a non-thinned-down region. Furthermore, the thinned-down region at least covers the light transmissive region. The display panel includes a substrate, a thin film transistor layer disposed on the substrate, and a first electrode disposed on a side of the thin film transistor layer away from the substrate. A thickness of the first electrode on the thinned-down region is less than a thickness of the first electrode on the non-thinned-down region.

Furthermore, on the non-thinned-down region, the first electrode includes: a first transparent electrode layer, a first metal layer disposed on the first transparent electrode layer, and a second transparent electrode layer disposed on a side of the first metal layer away from the first transparent electrode layer.

Furthermore, on the thinned-down region and the non-thinned-down region, the first electrode further includes: a third transparent electrode layer, a second metal layer disposed on the third transparent electrode layer, and a fourth transparent electrode layer disposed on a side of the second metal layer away from the third transparent electrode layer.

Furthermore, a thickness of the first metal layer ranges from 40 nm to 140 nm, and a thickness of the second metal layer ranges from 5 nm to 80 nm.

Furthermore, material of the first metal layer and the second metal layer includes a metal of copper, a metal of silver, a silver alloy, a metal of aluminum, or an aluminum alloy, and material of the first transparent electrode layer, the second transparent electrode layer, the third transparent electrode layer, and the fourth transparent electrode layer includes indium tin oxide.

Furthermore, the thinned-down region is the light transmissive region, or the thinned-down region is a rectangular region along a longitudinal direction of the display panel, and the rectangular region covers the light transmissive region.

Furthermore, the thin film transistor layer includes: a semiconductor layer disposed on the substrate, a first gate insulating layer disposed on the substrate and the semiconductor layer, a first gate electrode disposed on a side of the first gate insulating layer away from the substrate, a second gate insulating layer disposed on the first gate insulating layer and the first gate electrode, a second gate electrode disposed on the second gate insulating layer and away from the first gate insulating layer, an interlayer insulation layer disposed on the second gate electrode and the second gate insulating layer, a third metal layer disposed on a side of the interlayer insulation layer away from the second gate insulating layer.

Furthermore, the first electrode is electrically connected to the third metal layer.

Furthermore, the display panel includes a pixel defining layer disposed on the thin film transistor layer and the first electrode. The pixel defining layer has a groove, and the first electrode is exposed in the groove.

The present disclosure further provides a display device, including the display panel mentioned above. The display device includes a camera module, the camera module is disposed under the display panel and corresponds to the light transmissive region.

The present disclosure provides a display panel and a display device. When manufacturing the first electrode, depositing the first transparent electrode layer, the first metal layer, and the second transparent electrode layer on a region of the display panel, and etching the first transparent electrode layer, the first metal layer, and the second transparent electrode layer on the thinned-down region. After that, depositing the third transparent electrode layer, the second metal layer, and the fourth transparent electrode layer to form the first electrode of the display panel to realize the ultra thinning effect of the first electrode on the thinned-down region, which can increase the optical transmittance rate of the thinned-down region, and finally improves photography performance. The technology in which during use of the camera module, the display panel directly above the camera module does not display, and when not using the camera module, the display device can normally display, can realize the true full screen technology.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which those skilled in the art can derive further figures without making any inventive efforts.

DETAILED DESCRIPTION OF PREFERRED EMBODIMENTS

Figure 1:
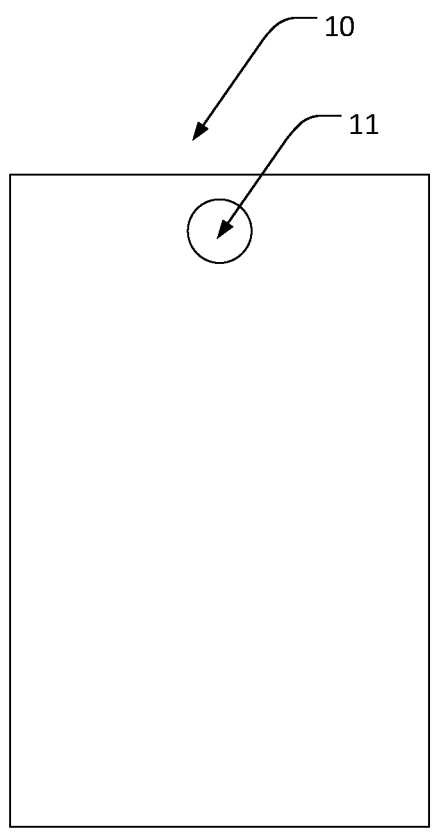
FIG. 1 is a plan view of a display panel in the prior art.

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., just refer to directions of the accompanying figures. The names of the elements mentioned in the present disclosure, such as "first", "second", etc., are only for distinguishing between different components or elements and can be better expressed. In the figures, units with similar structures are indicated by the same reference numerals.

Embodiments of the present disclosure will be described in detail herein with reference to the accompanying figures. The present disclosure may be embodied in many different forms and the present disclosure is not to be interpreted as being limited to the specific embodiments set forth herein. The embodiments of the present disclosure are provided to explain practical application of the present disclosure, so that those skilled in the art can understand various embodiments of the present disclosure and various modifications suitable for particular intended application.

Figure 2:
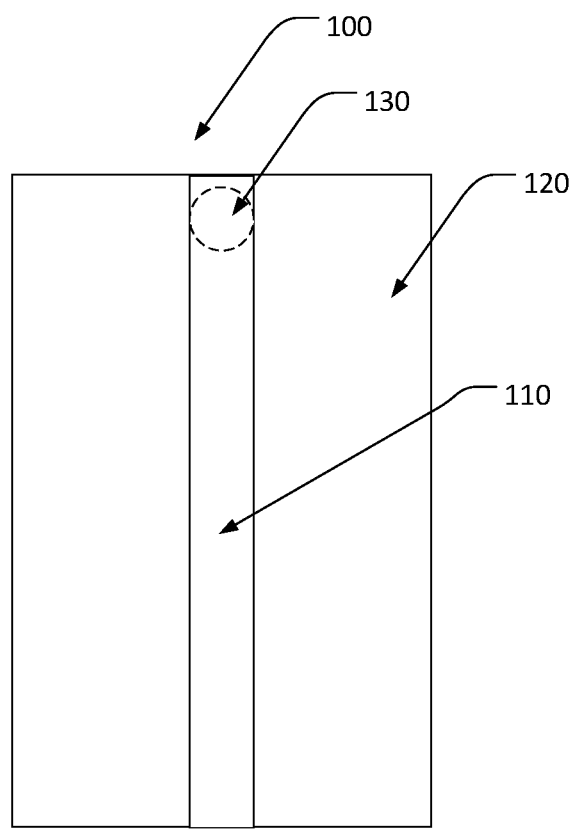
FIG. 2 is a plan view of a display panel provided by present disclosure.

As illustrated in FIG. 2, the present disclosure provides a display panel 100, which includes a thinned-down region 110, a non-thinned-down region 120, and a light transmissive region 130. The thinned-down region 110 and the non-thinned-down region 120 can display images to realize a true full screen. The thinned-down region 110 at least covers the light transmissive region 130 corresponding to an under screen camera.

Generally, the thinned-down region 110 corresponds to a position of an opening 11 on a traditional display panel 10 illustrated in FIG. 1. The thinned-down region 110 may also cover the position of the opening 11 on the traditional display panel 10 and extend to periphery of the traditional opening 11. In the present disclosure, a shape of the thinned-down region 110 is a square shape. A width of the thinned-down region 110 is greater than a diameter of the traditional opening 11, and a length of the thinned-down region 110 is a length of the display panel 100.

In short, the thinned-down region 110 may be the light transmissive region 130 corresponding to the under screen camera, or the thinned-down region 110 may be a rectangular region along a longitudinal direction of the display panel, and the rectangular region covers the light transmissive region 130 corresponding to the under screen camera.

Figure 3:
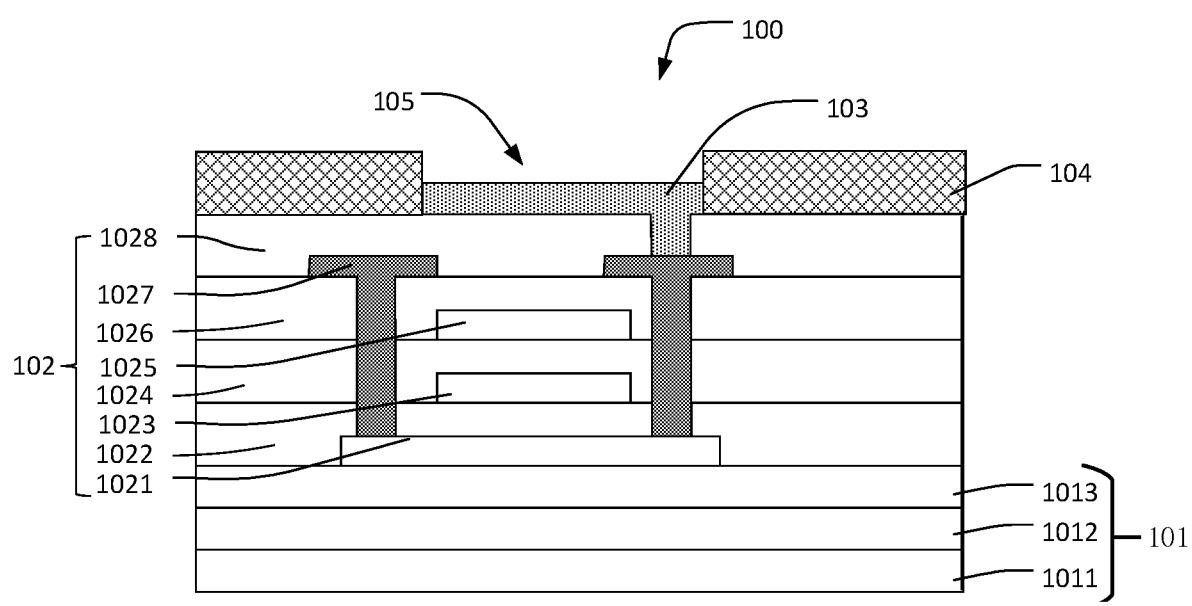
FIG. 3 is a structural diagram of the display panel provided by the present disclosure.

As illustrated in FIG. 3, the display panel 100 includes a substrate 101, a thin film transistor layer 102, a first electrode 103, and a pixel defining layer 104.

The substrate 101 includes a base layer 1011, a barrier layer 1012, and a buffer layer 1013, and material of the base layer 1011 is polyimide.

The barrier layer 1012 is disposed on the base layer 1011, and the buffer layer 1013 is disposed on a side of the barrier layer away from the base layer 1011.

The thin film transistor layer 102 is disposed on the substrate 101.

The thin film transistor layer 102 includes a semiconductor layer 1021, a first gate insulating layer 1022, a first gate electrode 1023, a second gate insulating layer 1024, a second gate electrode 1025, an interlayer insulation layer 1026, a third metal layer 1027, and a planarization layer 1028.

The semiconductor layer 1021 is disposed on a side of the buffer layer 1013 away from the barrier layer 1012. Material of the semiconductor layer 1021 is polycrystalline silicon or monocrystalline silicon.

The first gate insulating layer 1022 is disposed on the buffer layer 1013 and the semiconductor layer 1021. The first gate insulating layer 1022 is mainly to serve insulation between the adjacent metal layers to prevent from affecting working thereof.

The first gate electrode 1023 is disposed on a side of the first gate insulating layer 1022 away from the buffer layer 1013. The second gate insulating layer 1024 is disposed on the first gate electrode 1023 and the first gate insulating layer 1022. The second gate electrode 1025 is disposed on a side of the second gate insulating layer 1024 away from the first gate insulating layer 1022.

The interlayer insulation layer 1026 is disposed on the second gate insulating layer 1024 and the second gate electrode 1025. The third metal layer 1027 is disposed on a side of the interlayer insulation layer 1026 away from the second gate insulating layer 1024.

The planarization layer 1028 is disposed on the third metal layer 1027 and the interlayer insulation layer 1026.

The first electrode 103 is disposed on a side of the thin film transistor layer away from the substrate 101. The first electrode 103 is electrically connected to the third metal layer.

A thickness of the first electrode 103 on the thinned-down region 110 is less than a thickness of the first electrode 103 on the non-thinned-down region 120.

Figure 4:
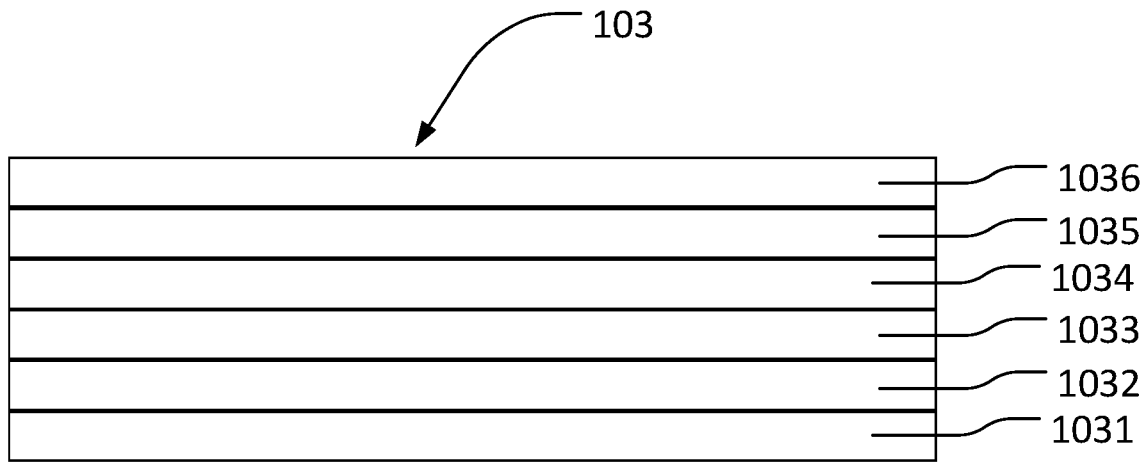
FIG. 4 is a structural schematic diagram of a first electrode on a non-thinned-down region provided by the present disclosure.

As illustrated in FIG. 4, on the non-thinned-down region 120, the first electrode 103 includes: a first transparent electrode layer 1031, a first metal layer 1032, and a second transparent electrode layer 1033.

Material of the first transparent electrode layer 1031 is indium tin oxide.

The first metal layer 1032 is disposed on the first transparent electrode layer 1031, and a thickness of the first metal layer 1032 ranges from 40 nm to 140 nm.

Material of the first metal layer 1032 includes a metal of copper, a metal of silver, a silver alloy, a metal of aluminum, or an aluminum alloy, and the material of the metal of silver is preferred for the present disclosure.

The second transparent electrode layer 1033 is disposed on a side of the metal layer away from the first transparent electrode layer 1031. Material of the second transparent electrode layer 1033 is indium tin oxide.

Figure 5:
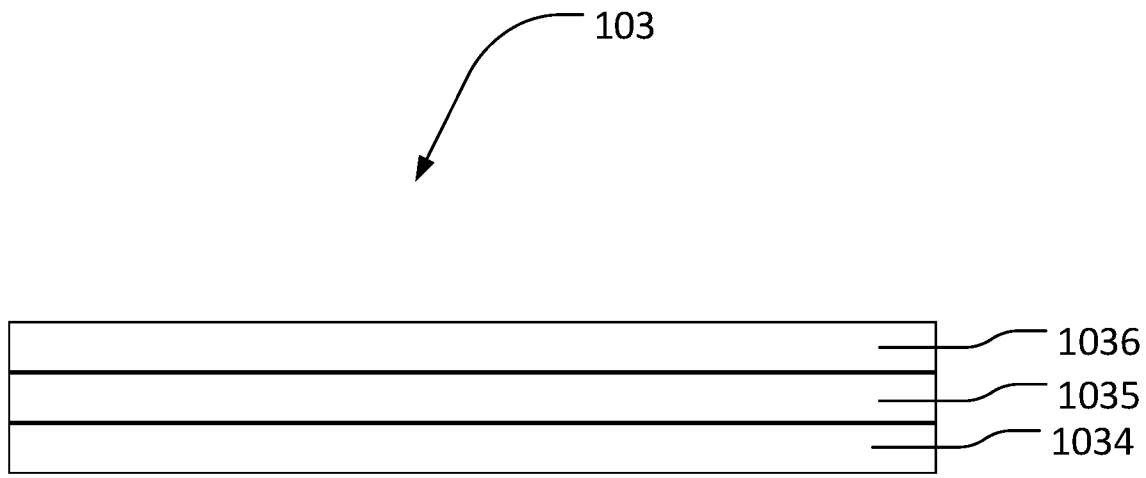
FIG. 5 is a structural schematic diagram of the first electrode on a thinned-down region provided by the present disclosure.

Please refer to FIG. 4 and FIG. 5, on the thinned-down region 110 and the non-thinned-down region 120, the first electrode 103 further includes: a third transparent electrode layer 1034, a second metal layer 1035, and a fourth transparent electrode layer 1036.

On the non-thinned-down region 120, the third transparent electrode layer 1034 is disposed on a side of the second transparent electrode layer 1033 away from the first metal layer 1032. On the thinned-down region 110, the third transparent electrode layer 1034 is disposed on the thin film transistor layer 102.

Material of the third transparent electrode layer 1034 includes indium tin oxide.

The second metal layer 1035 is disposed on the third transparent electrode layer 1034, and a thickness of the second metal layer 1035 ranges from 5 nm to 80 nm.

Material of the second metal layer 1035 includes a metal of copper or a metal of silver with conductivity, and the metal of silver is preferred for the present disclosure.

The fourth transparent electrode layer 1036 is disposed on a side of the second metal layer 1035 away from the third transparent electrode layer 1034. Material of the fourth transparent electrode layer 1036 is indium tin oxide.

Thicknesses of the first transparent electrode layer 1031, the second transparent electrode layer 1033, the third transparent electrode layer 1034, and the fourth transparent electrode layer 1036 are not limited specifically, and they may be same as each other.

Specifically, manufacturing processes of the first electrode 103 of the present disclosure are: firstly, depositing the first transparent electrode layer 1031, the first metal layer 1032, and the second transparent electrode layer 1033 on a region of the display panel 100, and etching the three-layer structures on the thinned-down region 110, and then, on the non-thinned-down region 120 and the thinned-down region 110, depositing the third transparent electrode layer 1034, the second metal layer 1035, and the fourth transparent electrode layer 1036 to form the first electrode 103 of the display panel 100, thereby realizing thinning down for the first electrode 103 on the thinned-down region 110, which can increase an optical transmittance rate of the thinned-down region 110.

The pixel defining layer 104 is disposed on the thin film transistor layer and the first electrode 103. The pixel defining layer 104 has a groove 105, and the first electrode 103 is exposed in the groove 105.

For the thinning down of the first electrode 103 on the thinned-down region 110, it can adjust homogeneity of the display panel 100 by debugging in a later stage.

Figure 6:
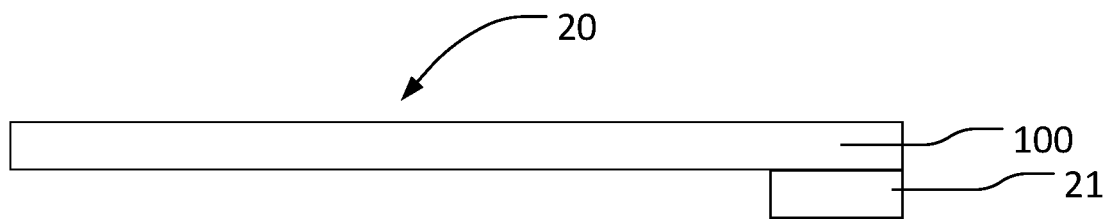
FIG. 6 is a structural schematic diagram of a display device provided by the present disclosure.

As illustrated in FIG. 6, the present disclosure further provides a display device 20, which includes the display panel 100 and a camera module 21. The camera module 21 is disposed on a bottom surface of the display panel 100 and corresponds to the thinned-down region 110. The camera module 21 is disposed on one of ends of the thinned-down region 110.

The present disclosure provides a display panel 100 and a display device 20. When manufacturing the first electrode 103, by depositing the first transparent electrode layer 1031, the first metal layer 1032, and the second transparent electrode layer 1033 on a region of the display panel 100, and etching the above-mentioned three-layer structure on the thinned-down region 110, after that, on the non-thinned-down region 120 and the thinned-down region 110, depositing the third transparent electrode layer 1034, the second metal layer 1035, and the fourth transparent electrode layer 1036 to form the first electrode 103 of the display panel 100, thereby realizing thinning down of the first electrode 103 on the thinned-down region 110, which can increase the optical transmittance rate of the thinned-down region 110, and finally improves photography performance.

When the camera module 21 is used, the display panel 100 directly above the camera module 21 does not display. When the camera module 21 is not used, the display device 10 can normally display. By this design, the true full screen technology is realized.

The technical scope of the present disclosure is not limited to the above description, and those skilled in the art can make various modifications and changes to the above embodiments without departing from the technical idea of the present disclosure, and this modifications and changes are all within the scope of the present disclosure.

What is claimed is:

1. A display panel, comprising a light transmissive region, a thinned-down region, and a non-thinned-down region, wherein the thinned-down region at least covers the light transmissive region, the display panel comprising:
    a substrate;
    a thin film transistor layer disposed on the substrate; and
    a first electrode disposed on a side of the thin film transistor layer away from the substrate;
    wherein the first electrode is disposed on the thinned-down region and the non-thinned-down region and comprises:
    a first transparent electrode layer;
    a first metal layer disposed on the first transparent electrode layer;
    a second transparent electrode layer disposed on a side of the metal layer away from the first transparent electrode layer;
    a third transparent electrode layer disposed on the second transparent electrode layer on the thinned-down region;
    a second metal layer disposed on the third transparent electrode layer; and
    a fourth transparent electrode layer disposed on a side of the second metal layer away from the third transparent electrode layer, and
    wherein the first transparent electrode layer, the first metal layer, second transparent electrode layer are etched out on the thinned-down region, and the third transparent electrode layer is disposed on the thin film transistor on the thinned-down region.

2. The display panel as claimed in claim 1, wherein a thickness of the first metal layer ranges from 40 nm to 140 nm, and a thickness of the second metal layer ranges from 5 nm to 80 nm.

3. The display panel as claimed in claim 1, wherein material of the first metal layer and the second metal layer comprises a metal of copper, a metal of silver, a silver alloy, a metal of aluminum, or an aluminum alloy; and
    material of the first transparent electrode layer, the second transparent electrode layer, the third transparent electrode layer, and the fourth transparent electrode layer comprises indium tin oxide.

4. The display panel as claimed in claim 1, wherein the thinned-down region is the light transmissive region, or the thinned-down region is a rectangular region along a longitudinal direction of the display panel, and the rectangular region covers the light transmissive region.

5. The display panel as claimed in claim 1, wherein the thin film transistor layer comprises:
    a semiconductor layer disposed on the substrate;
    a first gate insulating layer disposed on the substrate and the semiconductor layer;
    a first gate electrode disposed on a side of the first gate insulating layer away from the substrate;
    a second gate insulating layer disposed on the first gate insulating layer and the first gate electrode;
    a second gate electrode disposed on the second gate insulating layer and away from the first gate insulating layer;
    an interlayer insulation layer disposed on the second gate electrode and the second gate insulating layer;

a third metal layer disposed on a side of the interlayer insulation layer away from the second gate insulating layer.

6. The display panel as claimed in claim 5, wherein the first electrode is electrically connected to the third metal layer.

7. The display panel as claimed in claim 1, wherein the display panel comprises a pixel defining layer disposed on the thin film transistor layer and the first electrode, the pixel defining layer has a groove, and the first electrode is exposed in the groove.

8. A display device, comprising the display panel as claimed in claim 1, wherein the display device comprises a camera module, and the camera module is disposed under the display panel and corresponds to the light transmissive region.

* * * * *